United States Patent
Rao et al.

(10) Patent No.: US 8,488,363 B2
(45) Date of Patent: Jul. 16, 2013

(54) WRITE ENERGY CONSERVATION IN MEMORY

(75) Inventors: Hari M. Rao, San Diego, CA (US);
Jung Pill Kim, San Diego, CA (US);
Taehyun Kim, San Diego, CA (US);
Xiaochun Zhu, San Diego, CA (US);
Kangho Lee, San Diego, CA (US);
Wuyang Hao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 352 days.

(21) Appl. No.: 12/777,468

(22) Filed: May 11, 2010

(65) Prior Publication Data
US 2011/0280065 A1    Nov. 17, 2011

(51) Int. Cl.
*G11C 11/00* (2006.01)
(52) U.S. Cl.
USPC .................... 365/148; 365/189.04; 365/233.1
(58) Field of Classification Search
USPC .................. 365/148, 189.07, 233.1
See application file for complete search history.

(56) References Cited

U.S. PATENT DOCUMENTS

| | | | |
|---|---|---|---|
| 5,777,923 A | | 7/1998 | Lee et al. |
| 6,052,305 A | | 4/2000 | Yang et al. |
| 2002/0159286 A1 | * | 10/2002 | Sunaga et al. ................ 365/100 |
| 2003/0128578 A1 | * | 7/2003 | Perner ........................... 365/158 |
| 2006/0044867 A1 | * | 3/2006 | Ise ................................. 365/158 |
| 2009/0285008 A1 | * | 11/2009 | Jeong et al. .................. 365/148 |
| 2010/0067281 A1 | | 3/2010 | Xi et al. |
| 2010/0214825 A1 | * | 8/2010 | Chung et al. ................ 365/158 |
| 2011/0007551 A1 | * | 1/2011 | Tian et al. ..................... 365/148 |
| 2011/0063899 A1 | * | 3/2011 | Ogimoto ....................... 365/158 |

OTHER PUBLICATIONS

International Search Report and Written Opinion—PCT/US2011/035725—ISA/EPO—Oct. 10, 2011.

* cited by examiner

*Primary Examiner* — Hoai V Ho
(74) *Attorney, Agent, or Firm* — Sam Talpalatsky; Nicholas J. Pauley; Joseph Agusta (57) ABSTRACT

A method writes data to a resistive memory, such as spin torque transfer magnetic random access memory (STT-MRAM). The method writes received bits of data to a memory cell array, in response to a first write signal. The method also reads stored data from the memory cell array, after the first write signal is generated, and then compares the stored data with the received bits of data to determine whether each of the received bits of data was written to the memory. In response to a second write signal, received bits of data determined not to have been written during the first write signal, are written.

18 Claims, 7 Drawing Sheets

WRITE ENERGY CONSERVATION IN MEMORY

TECHNICAL FIELD

The present disclosure generally relates to electronic memory. More specifically, the present disclosure relates to efficiently writing data to resistive memory, such as magnetic random access memory (MRAM).

BACKGROUND

In order to write data into any resistance-based memory, a direct current generally flows through the memory for a period of time. In order to save power, (for example with battery powered devices, or "green" devices) the amount of current and/or the length of time the current flows should be reduced. The current has to be strong enough to change the state of memory cells of the resistance based memory. The length of time the current is applied controls the probability the write is successful, with longer write operations increasing the probability of a successful write operation.

BRIEF SUMMARY

Lower power for write operations results from a three stage write operation. A first write signal with a short write pulse writes data to most bits. A read then occurs to determine if any bits were not written during the first write signal. A second write signal with a longer write pulse writes any bits determined not to have been written during the first write pulse.

In one embodiment, a method for writing data to a memory includes writing received data to a memory cell array of the memory, in response to a first programmable write signal. The method also includes reading stored data from the memory cell array, after the first programmable write signal is generated. The method further includes comparing the stored data with the received data to determine whether all of the received data was written to the memory. The method also includes writing to the memory cell array received data determined not to have been written during the first programmable write signal, in response to a second programmable write signal.

In another embodiment, a memory circuit includes memory cell arrays, a write driver, a sensor, and a comparator. The write driver generates a first write signal to write received data to a memory cell array, in response to a first programmable write pulse. The sensor senses stored data from the selected cell array, after the first programmable write pulse is generated. The comparator compares the sensed data with the received data to determine whether all of the received data was written to the selected memory cell array. The write driver also generates a second write signal, in response to a second programmable write signal, to write to the selected memory cell array received data determined not to have been written during the first write signal.

In yet another embodiment, a computer readable medium tangibly stores instructions for writing data to a resistive memory. The medium includes instructions to generate a first programmable write signal to write received data to a memory cell array of the resistive memory. The medium also stores instructions to read stored data from the memory cell array, after the first programmable write signal is generated. The medium also stores instructions to compare the read data with the received data, on a bit-by-bit basis, to determine whether all of the received data was written to the resistive memory. The medium further stores instructions to generate a programmable second write signal to write to the memory cell array received bits of data determined not to have been written during the first programmable write signal.

In still another embodiment, a resistive memory circuit has memory cell arrays, generating means, reading means, and comparing means. The generating means generates a first write signal to write received bits of data to a selected memory cell array. The reading means reads stored data from the selected cell array, after the first write signal. The comparing means compares each bit of the read data with the received bits of data to determine whether each of the received bits of data was written to the selected memory cell array. The generating means also generates a second write signal, having a longer pulse width than the first write signal, to write to the selected memory cell array received bits of data determined not to have been written during the first write signal.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

The present disclosure relates to reducing power consumption when writing data to memory, such as resistive memory. Although the following description is with respect to resistive memory, the teachings apply to other forms of memory where a direct current flows in an operational mode, as well. Exemplary types of resistive memory include magnetic random access memory (MRAM), phase change (PC) memory, and solid electrolyte memory. These types of memory have a wide variety of uses including incorporation into wireless communication systems and devices, and the like.

Figure 1:
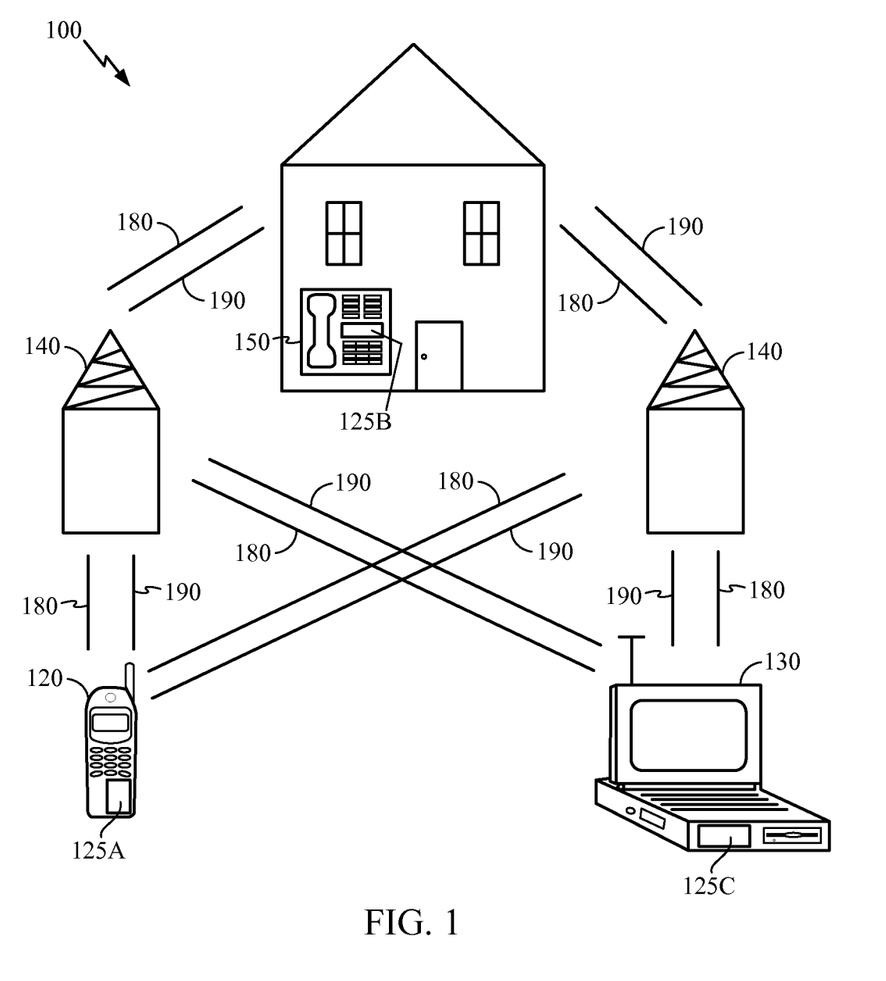
FIG. 1 is a block diagram showing an exemplary wireless communication system in which an embodiment of the invention may be advantageously employed.

FIG. 1 is a block diagram illustrating an exemplary wireless communication system 100 into which such memory may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include improved resistive memory 125A, 125B, and 125C, respectively, which are embodiments as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a computer in a wireless local loop system. Although the example embodiment depicted in FIG. 1 illustrates remote units according to the teachings of the disclosure, the disclosure is not limited to these exemplary illustrated units. For example, the remote units may be cell phones, hand-held personal communication systems (PCS) units, portable data units such as personal data assistants, or fixed location data units such as meter reading equipment. The present disclosure may be suitably employed in any device which includes the improved resistive memory.

The improved resistive memory efficiently performs write operations. When enabling a write pulse, for the duration of the write pulse, direct current (DC) power is consumed. By opening a write line only for those bits that need to be written, power can be saved.

Figure 2A:
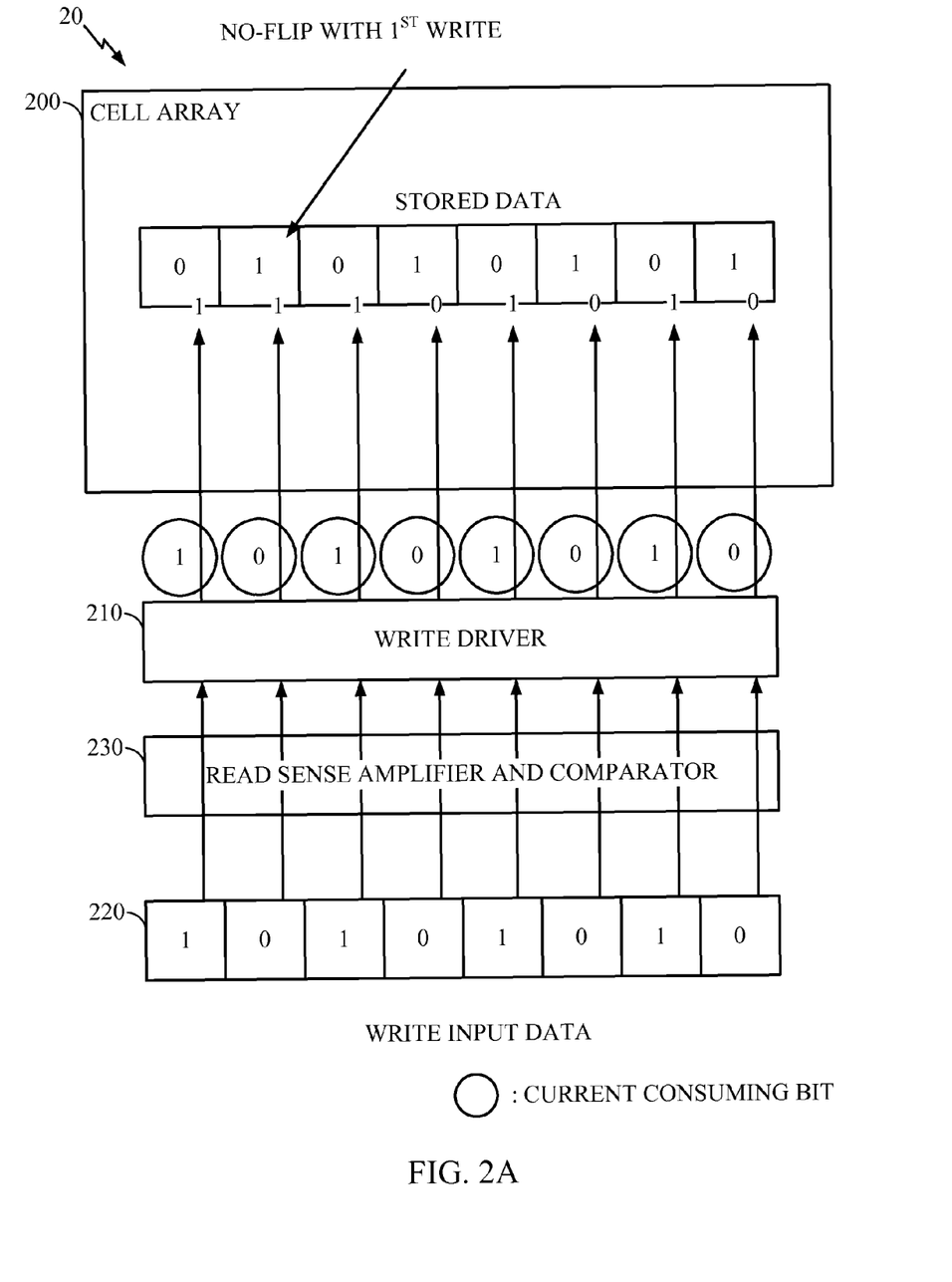
FIGS. 2A-2C are block diagrams showing operation of a three stage write operation.
Figure 2B:
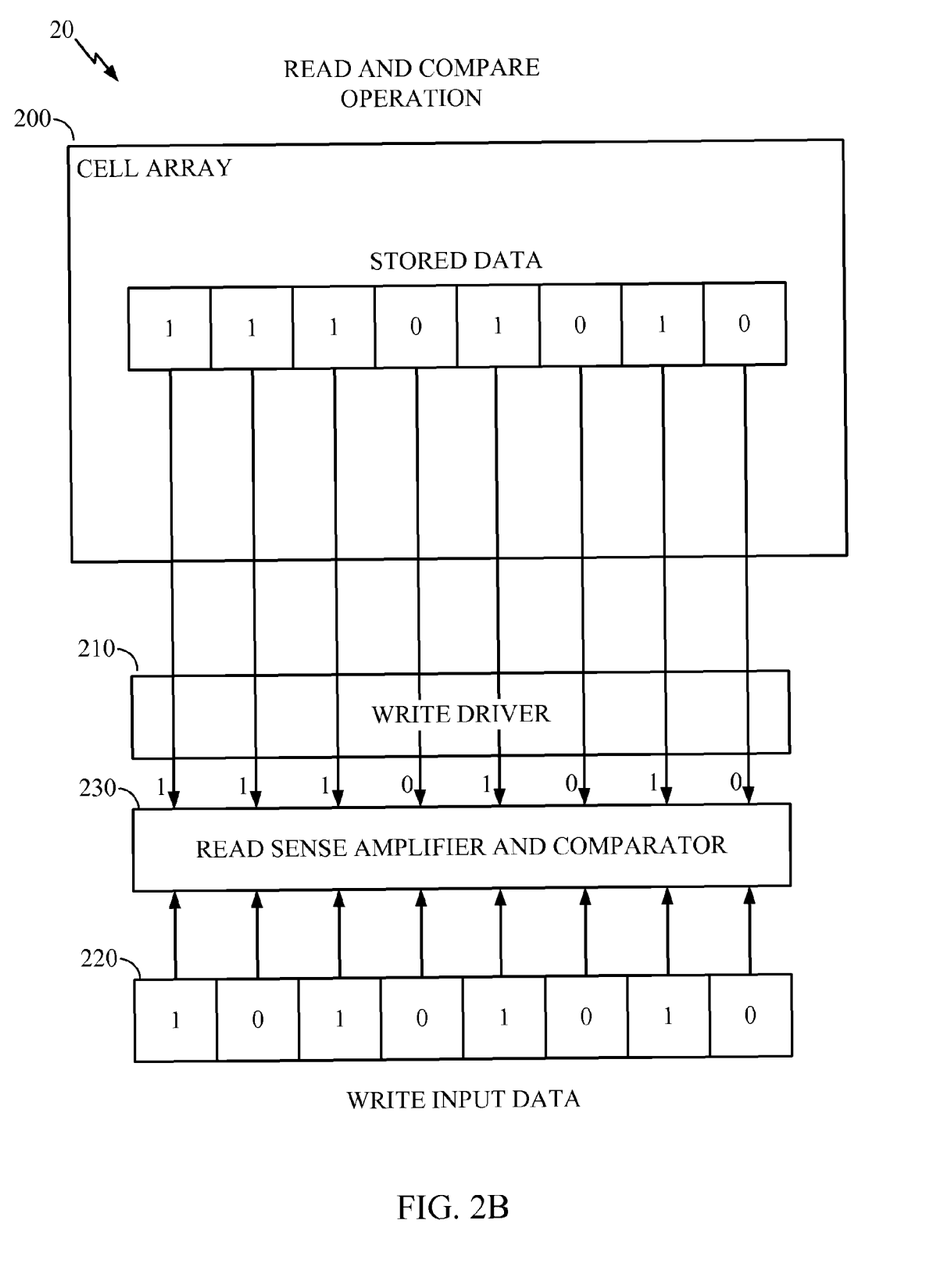
Figure 2C:
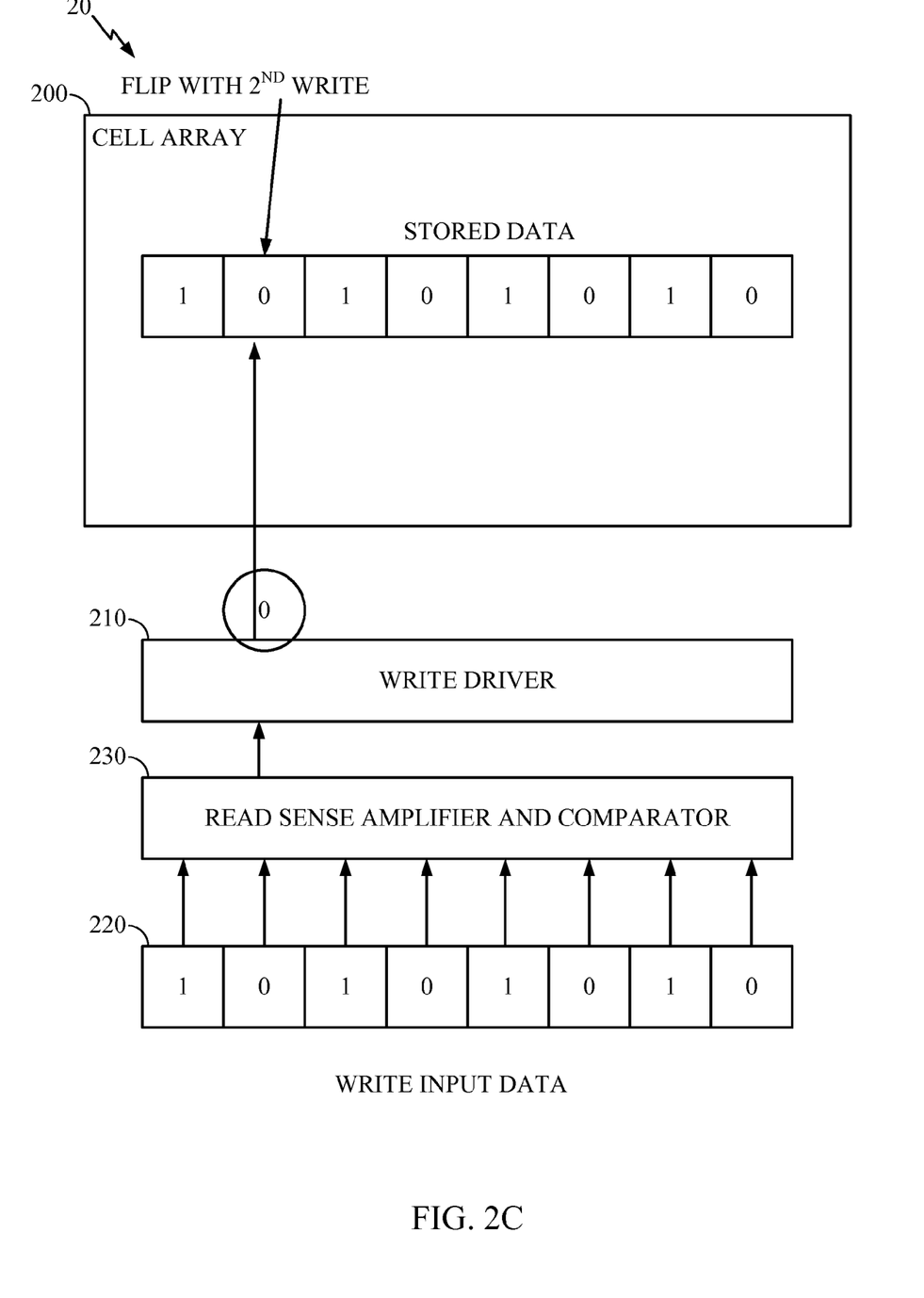

Referring now to FIGS. 2A-2C, a progression of block diagrams are shown illustrating an exemplary power saving write operation for a resistance based memory. The resistance based memory 20 includes a number of memory cell arrays 200, only one of which is depicted for clarity of explanation.

Figure 3:
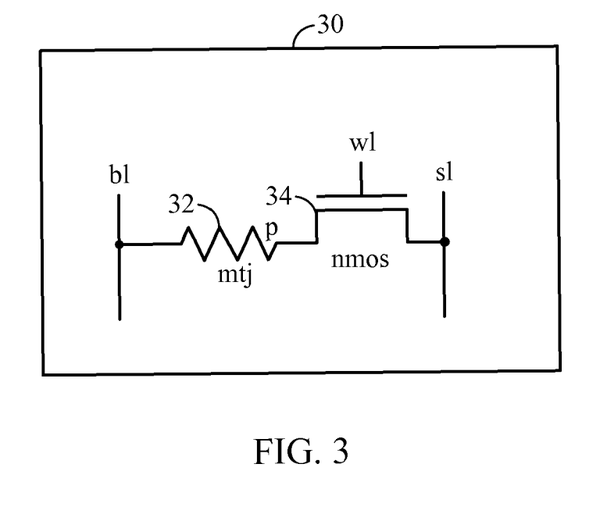
FIG. 3 is a circuit diagram showing an exemplary bit cell.

While the block diagrams of FIGS. 2A-2C present a high-level progression of a write procedure according to one embodiment of the present teachings, some details regarding the circuit configuration of the memory cell arrays 200 would be beneficial for purposes of the explanation of the write process. FIG. 3 is a circuit diagram illustrating an exemplary bit cell of the memory cell array 200 in more detail. In this example, the resistive bit cell is a spin torque transfer (STT) MRAM cell 30. The STT MRAM cell 30 includes a bitline, bl, coupled to a magnetic tunnel junction (MTJ) 32. The MTJ 32 is represented as a resistor in this diagram. A pass gate 34 is coupled between the MTJ 32 and a source line, sl. The pass gate 34 is controlled by a word line wl. In the depicted embodiment, the pass gate 34 is an N-channel MOSFET (NMOS). By asserting the word line, wl, to open the pass gate 34, grounding the bit line, bl, and connecting the source line, sl, to a power supply, a 1 is written to the MTJ 32, and thus the bit cell. Grounding the source line, sl, and connecting the bit line, bl, to the power supply writes a 0 to the MTJ 32, when the pass gate 34 is opened by the word line, wl.

Returning to FIG. 2A, before writing into a memory cell array 200, write input data 220 is pre-loaded into a write driver 210. Once the address information is received and a write command is issued, the write driver 210 writes the data into the addressed memory cell array 200. During this write, each of the bit cells consumes current. However, in one embodiment, the write is performed using a low-energy write pulse, thus, reducing overall current consumption. A low-energy write pulse may be implemented through a shortened pulse or by a pulse having a decreased current flow.

As shown in FIG. 2A, the stored data in the cell array 200 after the low-energy write includes a bit cell that was not properly written (i.e., the bit second from the left remains 0, although it should be 1). Referring now to FIG. 2B, the system recognizes the improper data in the bit cell. A read occurs with the read sense amplifier and comparator 230. Once the data is read from the cell array 200, the read sense amplifier and comparator 230 compares the read data with the write input data 220, on a bit by bit basis. As a result of the comparison, it is recognized that the second from the left bit cell includes an improper value. It is noted that read power is significantly lower than the write power in this system, and thus the read does not significantly impact overall power consumption.

Referring now to FIG. 2C, a second write is described. To save power, only the bit cells that were determined to contain incorrect data are written in the second write. In one embodiment, the columns containing the correct bit information are disabled for the second write. Accordingly, the system applies zero current on the source line, sl, and on the bit line, bl. When the word line, wl, is enabled the correctly written cells are not written because the correctly written cells see no Referring now to FIG. 4, a circuit diagram is shown illustrating an exemplary write driver and sense amplifier circuit. In this example, the source line, sl, being high and the bit line, bl, being grounded writes a 1. The sense amplifier/comparator 230 (FIGS. 2A-2C) receives reference data from a reference line, ref, and data from a bit line, bl. The reference data is the write input data 220 (FIGS. 2A-2C) for a particular bit cell. The data from the bit line, bl, is the data stored in that bit cell of the cell array 200 (FIGS. 2A-2C). If the sense amplifier/comparator 230 (FIGS. 2A-2C) determines the bit line data is the same as the reference data, the bit cell being read from does not need to be re-written. That is, the data was correctly written during the first low-energy write. Thus, the sense amplifier/comparator 230 (FIGS. 2A-2C) outputs 0 to NAND gates 42, 43. Accordingly, inverters 44, 45 receive 1s and output 0s to the bit line, bl, and source line, sl. Even if the write enable control line, WREN, passes a 1 to the NAND gates 42, 43 to enable a write, the sense amplifier/comparator 230 (FIGS. 2A-2C) overrides the write command by controlling the NAND gates 42, 43. That is, the sense amplifier/comparator 230 (FIGS. 2A-2C) recognizes the data was correctly written, so even though the write enable command instructs a higher-energy write, the sense amplifier/comparator 230 prevents the higher-energy write because it has determined the bit cell need not be written.

In case the sense amplifier/comparator 230 (FIGS. 2A-2C) does not determine the bit line data and reference data are the same, the sense amplifier/comparator 230 outputs 1s to the NAND gates 42, 43. The higher-energy write operation then proceeds normally, based upon the write enable signal and the write driver signal.

Figure 4:
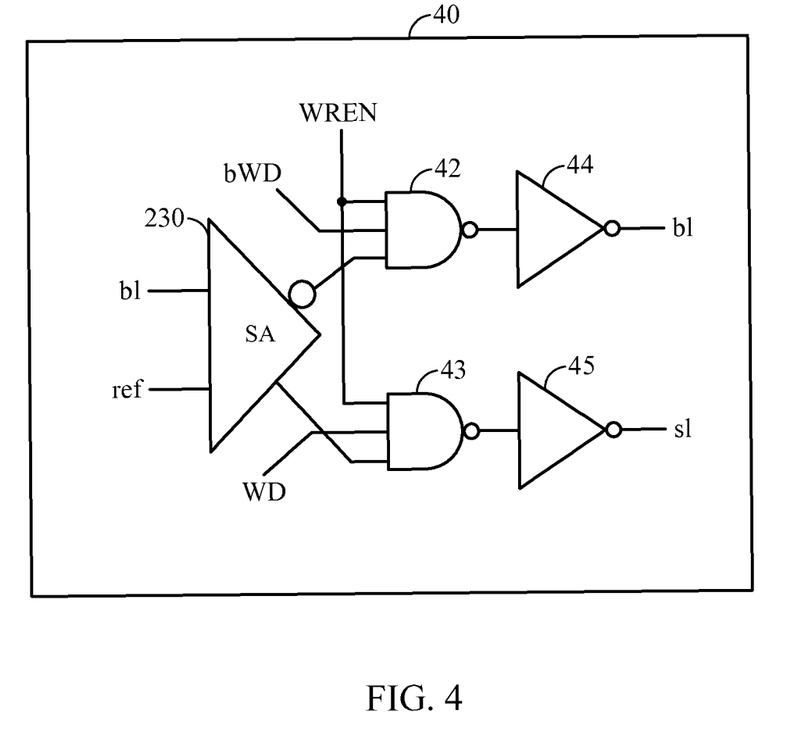
FIG. 4 is a circuit diagram showing an exemplary write drive and sense amplifier.

For example, when the write enable signal on the write enable line, WREN, is a 1, the write driver signal on the write driver line, WD, and write driver bar signal on the write driver bar line, bWD, control the current to be applied to the bit line, bl, and source line, sl. If the write driver signal is high (the write driver bar signal is low) the source line, sl is connected to the power supply and the bit line, bl, is grounded, resulting in a 1 being written to the bit cell. If the write driver signal is low (the write driver bar signal is high) the source line, sl, is grounded and the bit line, bl, is connected to the power supply, resulting in a 0 being written to the bit cell. If the write enable signal is 0, no write will occur, with both the bit line, BL, and source line, SL being grounded.

The preceding description was with reference to a circuit that compares data as soon as the bits are read out from the cell array, in the data path itself. Both operands of the comparison are readily available in the local data path. This local comparison uses less dynamic power because smaller capacitances will be switched. In another embodiment, the read data is brought out of the memory for the comparison.

In some embodiments, the first low-energy write is optional. That is, a read occurs first to determine what each bit cell currently stores, and then a higher-energy write occurs for the bit cells that need to be updated. In other embodiments, only the second higher-energy write occurs. That is, no read occurs, and only a single reliable write occurs. Determining whether the first two stages are optional can be based on the clock frequency of the system and desired power optimization. For example, if a technology generally needs 40 ns to reliably write data, there would be little benefit to adding a first ten ns write pulse. Thus, in this case, the first pulse would not occur. On the other hand, if the technology results in a high probability of writing a majority of the bit cells with a shorter pulse, the first write is deemed to be beneficial and would be included.

In some embodiments, the three stages occur in a single clock cycle. In other embodiments, the different stages occur in different cycles.

Figure 5:
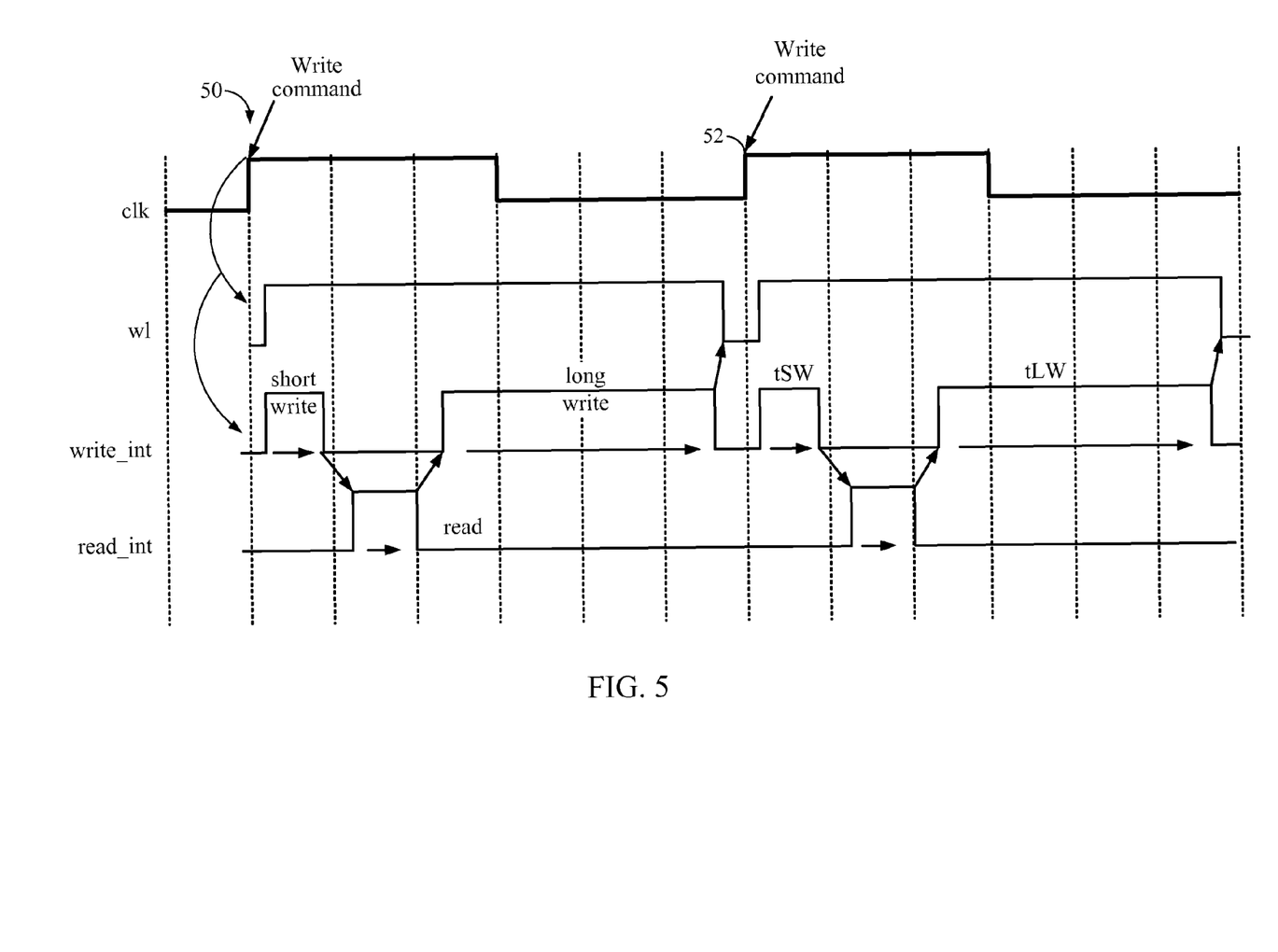
FIG. 5 is a timing diagram for a write in a low clock frequency system.

FIG. 5 is a timing diagram showing operation in a low clock frequency system. A write command occurs at the rising edge 50 of a first clock cycle. In response to the write command, a wordline, wl, is enabled and an internal write signal, write_int is asserted. The internal write signal, write_int, triggers a short write pulse for the first write. After the first write, an internal read signal, read_int, triggers a read operation. The compare (not shown) also occurs at this time. After the read and compare, another internal write signal, write_int, triggers a long write. Completion of the long write triggers deassertion of the word line, wl. Note that all of the events occurred within a single clock cycle. At the rising edge 52 of the next clock cycle, another write command issues and the same events follow.

Although FIG. 5 shows the word line, wl, remaining enabled during the read and compare, other embodiments deassert the word line, wl, during the read and compare, and re-assert the word line, wl, after the read and compare.

Figure 6:
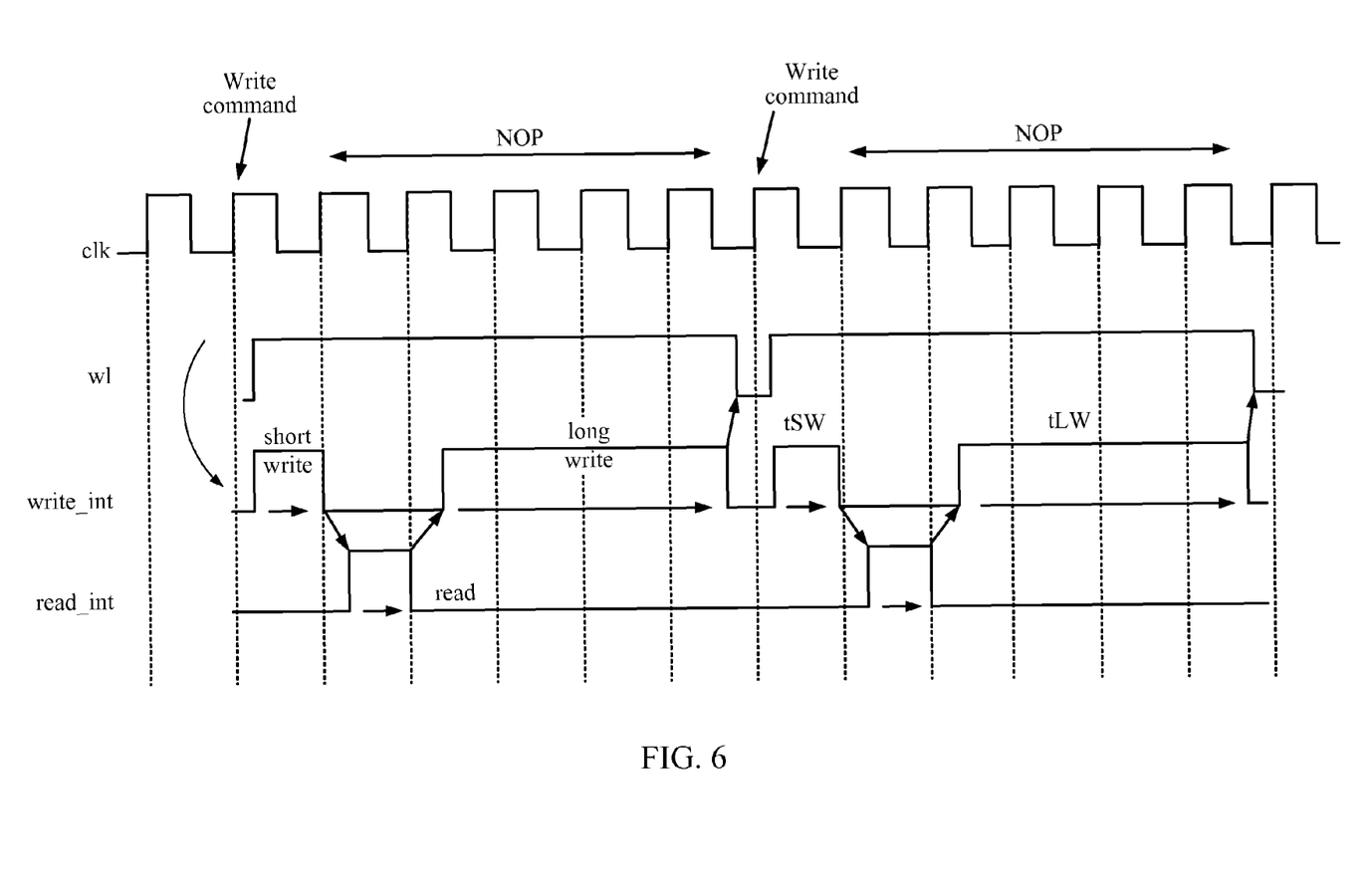
FIG. 6 is a timing diagram for a write in a high clock frequency system.

FIG. 6 is a timing diagram showing operation in a high clock frequency system. In this case, all events cannot occur in a single clock cycle due to the high frequency. Thus, a no operation signal, NOP, is issued for the duration of the read, and second write.

By initially writing with a short pulse, the system attempts to write all the cells that are easy to write. Some cells are easier to write compared to others because of process variation and so forth. The first write attempts to cover all the weak cells with a short pulse. The energy that is spent is reduced because the length of time is reduced. Thus, with the first write, most of the bit cells are captured with less energy than a normal length pulse. A read then occurs, and the stored data is compared with the write input data. The more energy consuming second read only occurs for the bit cells that were not properly written during the first write.

Although the preceding disclosure was with reference to saving power, improved reliability can be achieved in addition to or instead of reduced power. For example, both writes can be the same length, with the second write being for the purpose of ensuring the data was reliably written.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the technology of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, electronic devices, other electronic units designed to perform the functions described herein, or a combination thereof. For a firmware and/or software implementation, the methodologies maybe implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is to be limited to any particular type of memory or number of memories, or type of media upon which memory is stored.

If implemented in firmware and/or software, the functions may be stored as one or more instruction or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer, disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

What is claimed is:

1. A method for writing data to a memory, comprising:
   attempting a first writing of received data to a memory cell array of the memory, in response to a first programmable write signal;
   reading stored data from the memory cell array, after the first writing is attempted;
   comparing data stored in the memory cell array with the received data to identify memory cells of the memory cell array in which the received data was not effectively written to the memory during the first attempted writing; and
   attempting a second writing of the received data to only the identified memory cells of the memory cell array, in response to a second programmable write signal, the first programmable write signal having a shorter duration than the second programmable write signal.

2. The method of claim 1, in which the memory is resistive memory.

3. The method of claim 1, further comprising generating the first programmable write signal and generating the second programmable write signal in a same clock cycle.

4. The method of claim 2, in which writing to the memory cell array received data determined not to have been written during the first programmable write signal comprises grounding a source line and a bit line corresponding to each memory cell determined not to have been written during the first programmable write signal.

5. The method of claim 1, in which the comparing occurs locally.

6. A memory circuit, comprising:
   a plurality of memory cell arrays;
   a write driver that generates a first write signal to write received data to at least one of the memory cell arrays, in response to a first programmable write signal;
   a sensor that senses stored data from the memory cell array in response to the first write signal; and
   a comparator that compares the sensed stored data with the received data to identify memory cells of the memory cell array in which the received data was not effectively written to the memory cell array,
   the write driver generating a second write signal, in response to a second programmable write signal, the second write signal being configured to write the received data to only the identified memory cells of the memory cell array, the first programmable write signal having a shorter duration than the second programmable write signal.

7. The memory circuit of claim 6, in which each memory cell comprises a magnetic tunnel junction.

8. The memory circuit of claim 7, in which each memory cell further comprises a bit line coupled to the magnetic tunnel junction and a source line selectively coupled to the magnetic tunnel junction.

9. The memory circuit of claim 6, integrated into at least one semiconductor die.

10. The memory circuit of claim 6, further comprising a device, selected from the group consisting of a set top box, music player, video player, entertainment unit, navigation device, communications device, personal digital assistant (PDA), fixed location data unit, and a computer, into which the resistive memory circuit is integrated.

11. A computer readable medium tangibly storing instructions for writing data to a resistive memory, comprising:
   instructions to generate a programmable first write signal to attempt a first writing of received data to a memory cell array of the resistive memory;
   instructions to read stored data from the memory cell array, after the first writing is attempted;
   instructions to compare the data stored in the memory cell array with the received data, on a bit-by-bit basis, and to identify memory cells of the memory cell array in which the received data was not effectively written to the resistive memory during the first attempted writing; and
   instructions to generate a programmable second write signal to attempt a second writing of the received data to only the identified memory cells of the memory cell array, the first programmable write signal having a shorter duration than the second programmable write signal.

12. The medium of claim 11, further comprising instruction to generate the first programmable write signal and to generate the second programmable write signal in a different clock cycle.

13. The medium of claim 11, further comprising instructions to ground a source line and a bit line corresponding to each memory cell determined not to have been written during the first write pulse.

14. The medium of claim 11, integrated into a device, selected from the group consisting of a set top box, music player, video player, entertainment unit, navigation device, communications device, personal digital assistant (PDA), fixed location data unit, and a computer.

15. A method for writing data to a memory, comprising the steps of:
   generating a programmable first write signal to write received data to a memory cell array of the memory;
   reading stored data from the memory cell array, after the first programmable write signal is generated;
   comparing the read data with the received data to identify memory cells of the memory cell array in which the received data was not effectively written to the memory during the first programmable write signal; and
   generating a programmable second write signal to write the received data to only the identified memory cells of the memory cell array, the first programmable write signal being shorter duration than the second programmable write signal.

16. The method of claim 15, further comprising the step of integrating the generating, reading and comparing steps into a device selected from the group consisting of a set top box, music player, video player, entertainment unit, navigation device, communications device, personal digital assistant (PDA), fixed location data unit, and a computer.

17. A resistive memory circuit, comprising:
   a plurality of memory cell arrays;
   means for generating a first write signal to write received bits of data to a selected memory cell array;
   means for reading stored data from the selected cell array, after the first write signal; and
   means for comparing each bit of the read data with the received bits of data to determine whether each of the received bits of data was effectively written to the selected memory cell array, the generating means generating a second write signal, having a longer pulse width than the first write signal, the second write signal configured to write to the selected memory cell array only the received bits of data determined not to have been effectively written during the first write signal.

18. The resistive memory circuit of claim 17, integrated into at least one spin torque transfer (STT) magnetic random access memory (MRAM) semiconductor die.

\* \* \* \* \*